(12) United States Patent
Steger

(10) Patent No.: US 7,869,184 B2
(45) Date of Patent: Jan. 11, 2011

(54) METHOD OF DETERMINING A TARGET MESA CONFIGURATION OF AN ELECTROSTATIC CHUCK

(75) Inventor: Robert Steger, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1432 days.

(21) Appl. No.: 11/289,313

(22) Filed: Nov. 30, 2005

(65) Prior Publication Data

US 2010/0159712 A1    Jun. 24, 2010

(51) Int. Cl.
*H01L 21/683* (2006.01)
(52) U.S. Cl. ..................... 361/234
(58) Field of Classification Search .......... 361/234
See application file for complete search history.

(56) References Cited

U.S. PATENT DOCUMENTS

| | | | |
|---|---|---|---|
| 5,903,428 | A | 5/1999 | Grimard et al. |
| 6,320,736 | B1 | 11/2001 | Shamouilian et al. |
| 6,490,145 | B1 | 12/2002 | Kholodenko et al. |
| 6,847,014 | B1 | 1/2005 | Benjamin et al. |
| 6,863,281 | B2 | 3/2005 | Endou et al. |
| 6,907,364 | B2 | 6/2005 | Poolla et al. |
| 2004/0055709 | A1 | 3/2004 | Boyd et al. |
| 2004/0107066 | A1* | 6/2004 | Poolla et al. ........... 702/136 |
| 2004/0233608 | A1* | 11/2004 | Brcka ............. 361/234 |
| 2005/0045106 | A1 | 3/2005 | Boyd et al. |
| 2005/0087939 | A1 | 4/2005 | Caldwell et al. |
| 2006/0021705 | A1 | 2/2006 | Imai et al. |

OTHER PUBLICATIONS

International Search Report and Written Opinion dated Apr. 21, 2008 for PCT/US06/42577.
Australian Search Report mailed Feb. 12, 2009 for SG 200804109-7.
International Preliminary Report on Patentability mailed Mar. 24, 2009 for PCT/US2006/042577.

* cited by examiner

*Primary Examiner*—John Fitzgerald
*Assistant Examiner*—Nathaniel Kolb
(74) *Attorney, Agent, or Firm*—Buchanan Ingersoll & Rooney PC

(57) ABSTRACT

A method of modifying the heat transfer coefficient profile of an electrostatic chuck by configuring the areal density of a mesa configuration of an insulating layer of the chuck is provided. A method of modifying the capacitance profile of an electrostatic chuck by adjustment or initial fabrication of the height of a mesa configuration of an insulating layer of the chuck is further provided. The heat transfer coefficient at a given site can be measured by use of a heat flux probe, whereas the capacitance at a given site can be measured by use of a capacitance probe. The probes are placed on the insulating surface of the chuck and may include a plurality of mesas in a single measurement. A plurality of measurements made across the chuck provide a heat transfer coefficient profile or a capacitance profile, from which a target mesa areal density and a target mesa height are determined. The target density and height are achieved mechanically; the target density by mechanically adjusting the areal density of existing mesas; and the target height by creating or deepening low areas surrounding planned or existing mesas, respectively. This can be accomplished using any of known techniques for controlled material removal such as laser machining or grit blast machining on an X-Y table.

17 Claims, 3 Drawing Sheets

METHOD OF DETERMINING A TARGET MESA CONFIGURATION OF AN ELECTROSTATIC CHUCK

BACKGROUND

As semiconductor technology progresses, decreasing transistor sizes call for an ever higher degree of accuracy, repeatability and cleanliness in wafer processes and process equipment. Various types of equipment exist for semiconductor processing, including applications that involve the use of plasmas, such as plasma etch, plasma-enhanced chemical vapor deposition (PECVD) and resist strip. The types of equipment required for these processes include components which are disposed within the plasma chamber, and must function consistently and properly. To be cost effective, such components must often withstand hundreds or thousands of wafer cycles while retaining their functionality and cleanliness. One such component, the electrostatic chuck, is used to retain a semiconductor wafer or other workpiece in a stationary position during processing. The electrostatic chuck provides more uniform clamping than chucks employing mechanical clamping, and can operate in vacuum chambers where a vacuum chuck cannot be used. However, variations in aspects of the clamping can cause undesirable process variations within a wafer.

SUMMARY

A method of modifying the heat transfer coefficient profile of an electrostatic chuck by configuring the areal density of a mesa configuration of an insulating layer of the chuck is provided. The heat conduction at a given site can be measured by use of a heat flux probe. The probe is placed on the insulating surface of the chuck and overlies a plurality of mesas in a single measurement. A plurality of measurements across the chuck surface provide a heat transfer coefficient profile from which a target mesa areal density is determined. Using the target areal density, a mechanical correction can be made to one or more locations of the mesa configuration on the chuck. The contact area of the mesas within the local measurement area is reduced by an amount sufficient to change the local mesa areal density to the desired mesa areal density. This can be accomplished using any of known techniques for controlled material removal such as laser machining or grit blast machining on an X-Y table.

A method of modifying the capacitance profile of an electrostatic chuck by adjustment or initial fabrication of the height of a mesa configuration of an insulating layer of the chuck is also provided. A target mesa height can be determined by use of a capacitance probe. The probe is placed on the insulating surface of the chuck and overlies a plurality of mesas in a single measurement site. A plurality of measurements across the chuck surface can be made to provide a capacitance profile from which a target mesa height is determined. Using the target height, a mechanical fabrication or correction can be effected at each of the measurement sites. This can be accomplished using any of known techniques for controlled material removal. Furthermore, transitions between regions of different heights can be smoothed.

DETAILED DESCRIPTION

Figure 1:
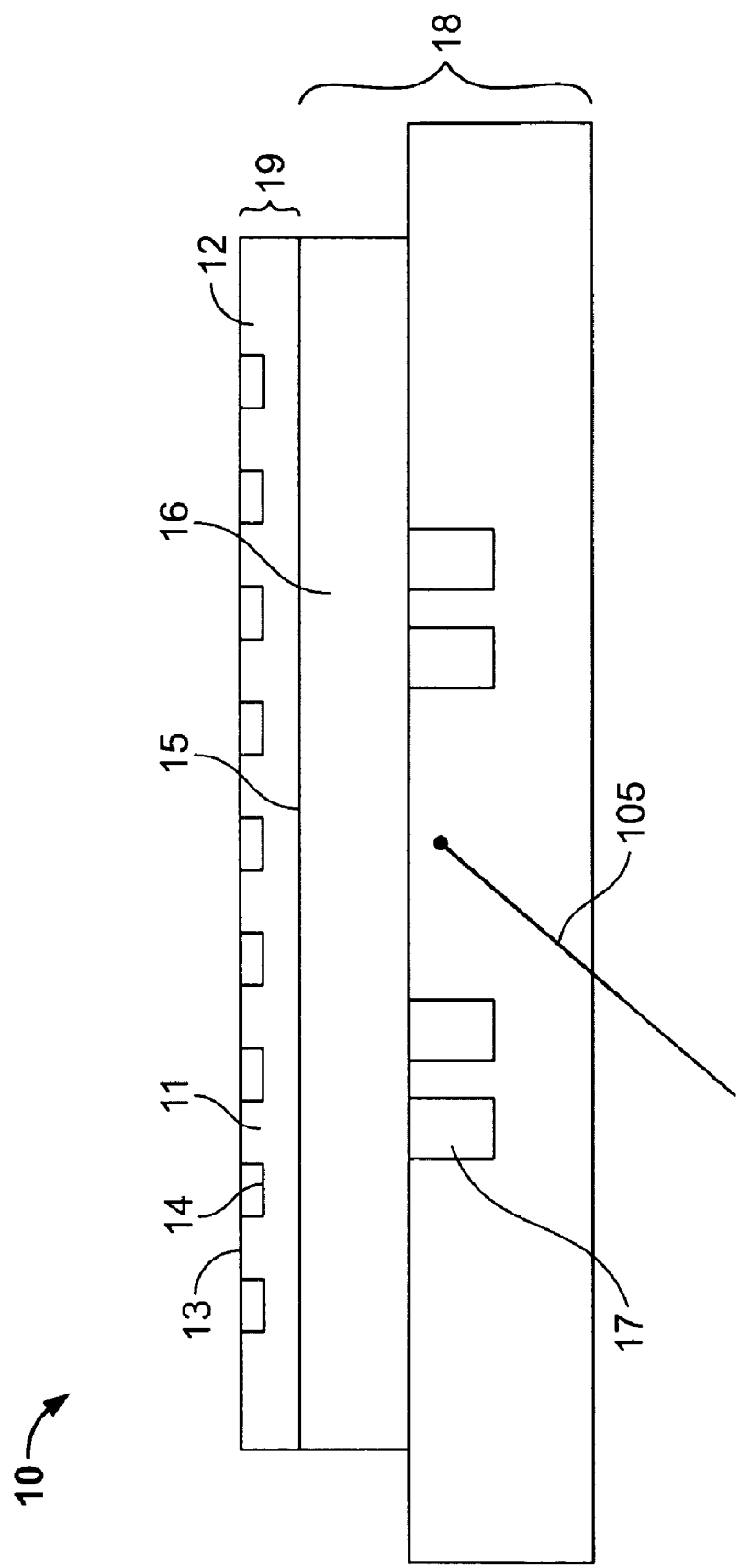
FIG. 1 depicts a schematic of a cross section of an exemplary electrostatic chuck with mesas, showing a conductive base and an insulating layer.

Plasma processing apparatuses for semiconductor substrates, such as silicon wafers, include plasma etch chambers which are used in semiconductor device manufacturing processes to etch such materials as semiconductors, metals and dielectrics. Components of plasma processing apparatuses include electrostatic chucks, which are used to retain semiconductor wafers or other workpieces in a stationary position during processing. Electrostatic chucks (ESC) provide more uniform clamping and better utilization of the surface of a wafer than mechanical chucks and can operate in vacuum chambers where vacuum chucks cannot be used. In general, electrostatic chucks comprise an electrically insulating layer over a conductive body, the conductive body in electrical contact to one or more electrodes, to which a chucking voltage is applied. The wafer is maintained in position against the insulating layer by an attractive coulombic force. The shape of the chuck may include a conventional disk commonly used in plasma etching systems and the chuck may be supported in the chamber by various arrangements, such as by using a cantilever. The insulating layer may have grooves, mesas, openings, recessed regions, and like features.

As demands on process outputs such as wafer uniformity increase, the wafer chuck is required to deliver higher performance. For example, process control problems in critical etch applications call for improved control of temperature and capacitance across the wafer. Error in the accuracy of lateral dimensions in some etch processes can be sensitive to temperature and be up to $+/-1$ nm/° C. A desirable control of lateral features of 1-2 nm therefore requires temperature uniformity and repeatability of less than 1° C. Some types of electrostatic chucks comprise multiple component parts, each introducing some error. For example, a tunable electrostatic chuck is a complex structure which involves the ESC ceramic, a bond to an aluminum plate, a thin film heater, a bond to a baseplate, and the baseplate itself. Deviations from uniformity for each component of the structure may contribute to a greater overall deviation. A compensation for natural variation in the manufacturing process applied to electrostatic chucks which may comprise multiple components would be advantageous.

In manufacturing a chuck with a mesa configuration, 21, the fabrication process generally comprises the removal of material at the surface of the insulating layer to a depth of about 5 µm to about 40 µm, such that small area features ("mesas") are left to support the wafer 11. Mesas can be of virtually any size, shape and arrangement. For example, mesas can be elliptical, polygonal or torroidal, have vertical or sloped walls, the top surfaces can be concave, flat or convex, and the corners can be sharp or rounded. The mesas can take on a "bump" shape wherein a partial spherical shape is emerging from a flat surface. A preferred mesa shape, size and arrangement, is circular with vertical walls, a diameter of about 1 mm, a spacing of about 5 mm, substantially covering the ESC surface, respectively 21. A continuous sealing high area 12, 22 is often retained at or near the wafer edge so as to maintain the pressure of a heat transfer gas such as helium used to enhance thermal conductivity. In such a configuration, typically about 3% to about 10% of the chuck surface is mesas and the sealing area at the edge. Advantageously, mesa designs facilitate backside particle reduction and improve dechucking.

The mesas and sealing area are generally formed from one or more layers of an electrically insulating material. Examples of such insulating materials include, but are not limited to, silicon nitride, silicon dioxide, alumina, tantalum pentoxide, and the like.

Figure 2:
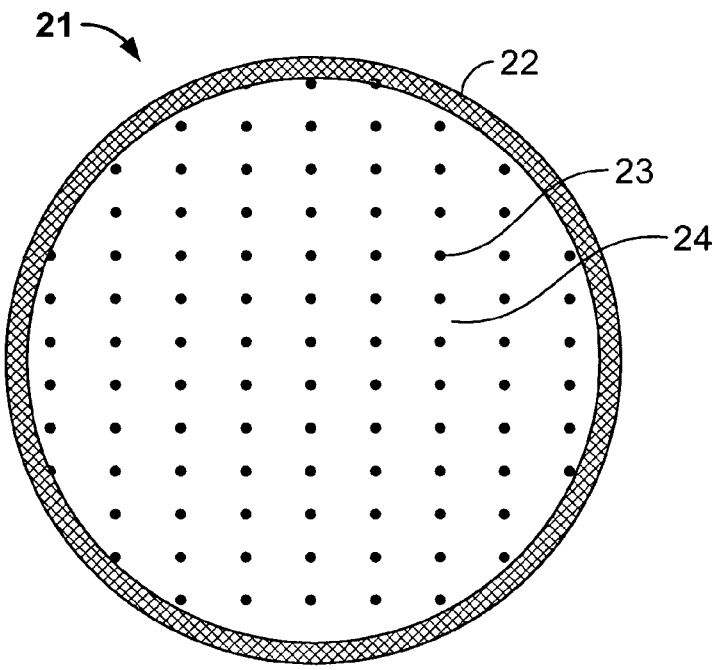
FIG. 2 depicts a plan view of the chuck of FIG. 1, showing a mesa configuration and a continuous edge region.

FIGS. 1 and 2 show a version of an electrostatic chuck assembly which uses mesas. The electrostatic chuck assembly 10 comprises a conductive support 18, an electrically insulating layer 19, high areas of the electrically insulating layer 13, 23, and low areas of the electrically insulating layer 14, 24. The conductive support 18, formed of a conductive metal such as aluminum, is electrically connected to an RF circuit of a plasma processing apparatus (not shown) for plasma processing a workpiece, such as a 200 mm or 300 mm wafer. In the electrostatic chuck assembly 10 in FIG. 1, the lower surface 15 of the insulating layer 19 is in contact with the conductive support 18. The high areas 13 of the insulating layer 19 support a semiconductor substrate (not shown). A thermocouple 105 is incorporated into the conductive support 18 for temperature measurements. Cooling channels 17 are provided in the conductive support 18 for supply of temperature control fluids or gasses. In particular, conductive support 18 is preferably adapted to accept a temperature control unit, or TCU (not shown) which is capable of maintaining the temperature of the conductive support to a desired temperature by use of fluid flowing through a recirculation loop.

Preferably, the aluminum support 18 is about 1.5 inches thick. The support has boss 16 designed to underlie a wafer and has a height of about 0.5 inches. For example, to support a 200 mm or smaller diameter wafer, the boss is preferably circular with a 200 mm diameter. The insulating layer 19 is preferably ceramic such as alumina or AlN, with a thickness of preferably less than about 5 mm thick, more preferably about 1 mm thick. The dielectric layer could be a plasma spray material, for example, alumina over an aluminum substrate. The thickness of the alumina is preferably about 25 mils (635 µm), and, in any event, must be thick enough to allow for the creation of mesas as high as 200 µm without losing physical or electrical integrity either during the manufacturing process or during use.

A preferred embodiment involves a modification of a mesa configuration of an ESC to achieve a target etch profile across the wafer surface. A mesa configuration can be described using two primary dimensions: mesa height and mesa area. In embodiments, control of mesa area is used as a mechanism to control temperature, and control of mesa height is used as a mechanism to control capacitance. An assessment of each mechanism is made separately. A preferred embodiment of a method to control temperature through the adjustment of mesa area is given in Example 1, and preferred embodiments of methods to control capacitance through adjustment or initial fabrication of mesa height are given in Examples 2 and 3. The examples are intended to be illustrative rather than exclusionary:

Example 1

During normal plasma processing, such as plasma etching, the plasma acts to heat the wafer. The temperature fluctuation of the wafer is therefore a function of heat flow out of the wafer. According to the theory of heat flow, heat transfer can occur in three ways: conduction, convection and emission of radiation. For the following assessment, emission of radiation is neglected. A heat transfer coefficient K is defined as a heat flow per unit of temperature difference between two bodies. K of a wafer on a chuck with mesas can be determined by considering the high and low areas as two cases: 1) the heat transfer that occurs over a low area, and 2) the heat transfer that occurs over a high area (mesa). In the case of the low area, the heat transfer occurs through a mechanism of energy transfer from the wafer at the higher temperature to the gas, and from the gas to the ceramic layer. Even though the gas may be in the free molecular flow regime (mean free path much greater than the size of the container), for this assessment, this mechanism of heat transfer is classified as convection. In the case of the mesa, due to surface roughness of the ceramic, direct contact between the ceramic and the wafer occurs over an area which is less than the nominal contact area (the high area). Gas is present interstitial to the contact points and contributes to the heat transfer through convection. Thus the heat transfer occurring over a mesa is due to both contact (conduction) and through the gas (convection). Conduction due to contact is present whether or not gas is present, but convection does not occur in the low areas when gas is not present. When gas is present, both mechanisms exist in the high areas, suggesting that heat transfer increases with increasing high area. Thus the local heat transfer rate is adjustable by modifying the mesa area locally, that is, increasing the proportion of mesa area increases the heat transfer rate whereas reducing the proportion of the mesa area reduces the heat transfer rate.

A heat flux probe can be used to measure both heat flux and local wafer temperature. For the present assessment, operation of a heat flux probe can be carried out in one of two ways: 1) by measuring the wafer temperature at a given heat flux; or 2) by adjusting the heat flux to that which is required to achieve a desired wafer temperature, for example a uniform temperature. In both cases the measurements take place at a plurality of sites, typically such that the sites are arranged in an ordered grid pattern which generally covers the chuck. Preferably, at least 10 mesas are included in each single measurement, more preferably, at least 30 mesas are included. In the first case a temperature profile results, and in the second case a heat flux profile results.

In a preferred embodiment, a temperature profile is generated and the information is used to generate a heat transfer coefficient (HTC) profile. The HTC profile is then used to alter the insulating layer to effect alteration in the heat flux across the wafer. For example, the insulating layer can be altered to compensate for observed variation in the temperature profile. In alternative embodiments, the insulating layer can be altered to compensate for observed variation in an etch profile of a semiconductor wafer.

Figure 3:
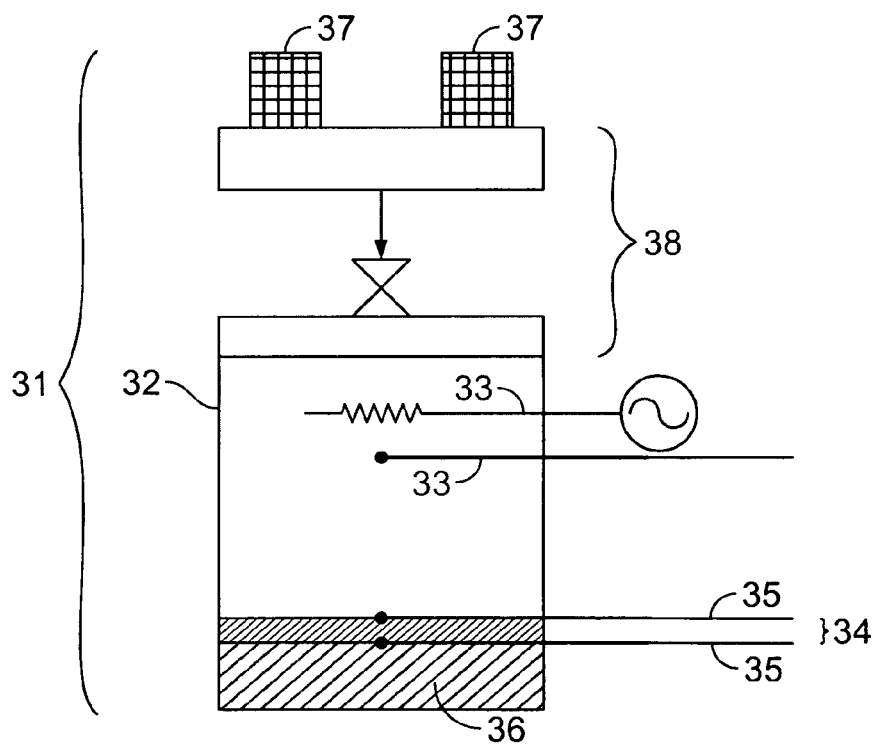
FIG. 3 shows an exemplary heat flux probe including a heater block, a mechanism to apply force, an HFT and silicon piece.

An exemplary embodiment of a preferred probe 31 for heat flux measurement is shown in FIG. 3. The probe consists of a vertical cylindrical stack of about 1" diameter, although the cross-sectional shape of the probe is not restricted to circular. The probe could have a square, rectangular, triangular or any polygonal shape in cross-section. At the top of the stack, a heater block 32 is situated, the heater block comprising an embedded small adjustable heater and thermocouple 33, the heater having a maximum power output of about 50 watts. Exemplary heaters such as the ¼" diameter, 0.25 mm thick, 279232 CIR-1016 120V 50 W cartridge heater are available from Chromalox, Inc., Pittsburgh, Pa. Attached proximate and below the heater block is a Heat Flux Transducer (HFT) 34, comprising a thin sheet of controlled thermal resistance material. Temperature sensors 35 form a thermopile, and are attached to the top and bottom surfaces of the HFT. Heat flux transducers like the one shown in FIG. 3 are commercially available, for example, the model BF-04 HFT from Vatell Corp, Christiansburg, Va. Heat Flux Transducers are available in different sizes, and provide a reading of the flux, for example, in mV/(W/cm$^2$), as well as the lower sensor temperature. An amplifier, such as the AMP-12 from Vatell (not shown) is used cooperatively with the HFT.

In order to simulate the measurement of a silicon wafer, attached proximate and below the HFT is a piece of silicon wafer 36, of approximately the same area as the HFT. A temperature measurement from the lower sensor is therefore a measurement of wafer temperature. Both attachments to the HFT are made with high thermal conductivity bonding materials. A downward force can be applied to the probe to facilitate contact. For example, an amount of force may be used to approximate that of the ESC clamping pressure, e.g. 40 Torr. In the probe 31, the downward force is represented by deadweights 37 and a mechanism to evenly distribute the downward force 38, but other mechanisms to apply and distribute force could be used as well. Additionally, the chuck temperature is preferably held constant during the measurement.

Figure 4:
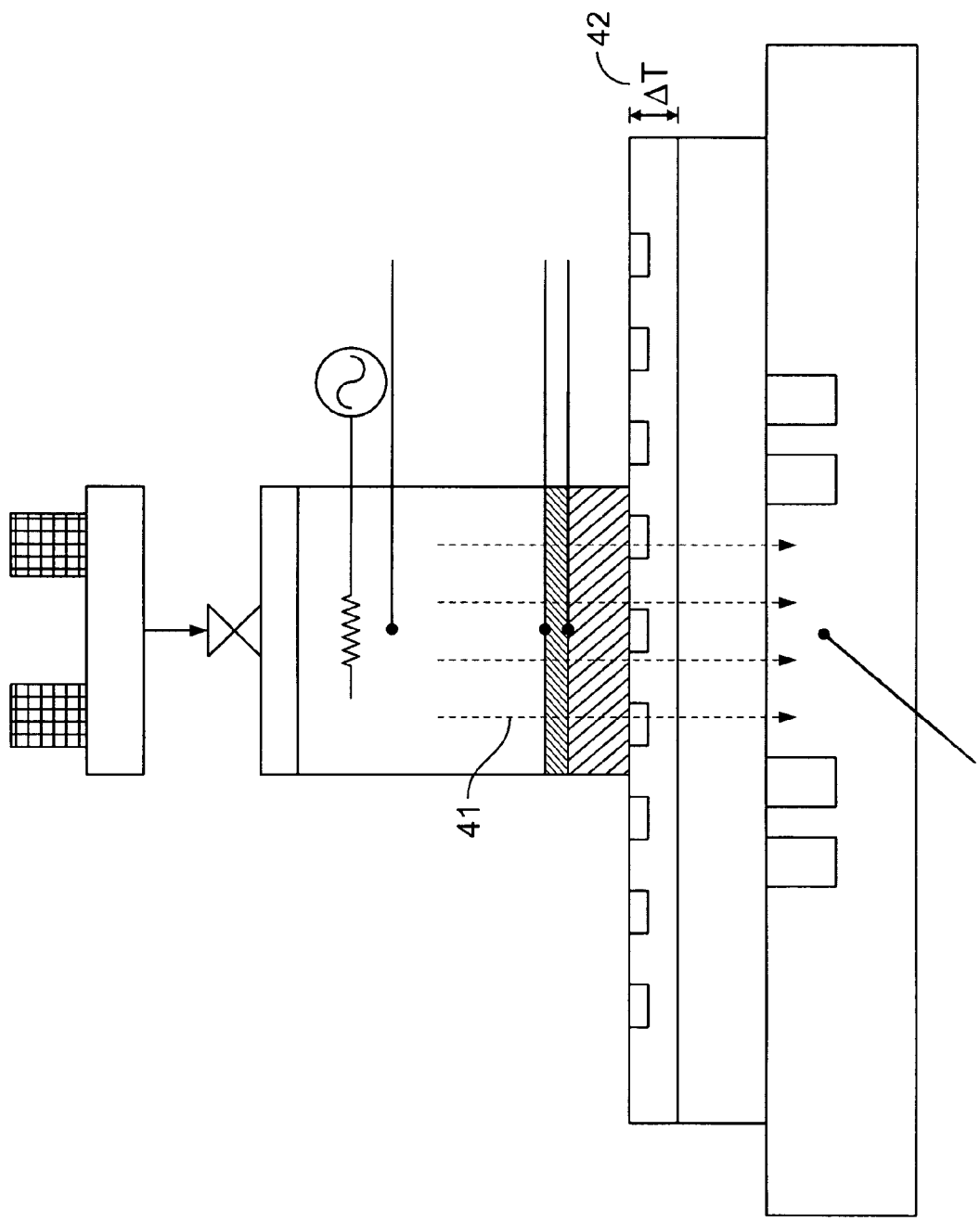
FIG. 4 shows the heat flux probe of FIG. 3 placed on the electrostatic chuck of FIG. 1 and heat flow.

A depiction of an exemplary probe disposed on an exemplary chuck is shown in FIG. 4. Heat flux Q 41 flows from the heater block through the wafer piece and into the chuck over a probe area $A_p$. Both Q and $A_p$ are treated as constants for the purpose of this assessment. The temperature difference 42 between the conductive support and the wafer is denoted by $\Delta T$, and an effective heat transfer coefficient within the probe area is denoted by $K_{eff}$. $K_{eff}$ can be determined by treating conduction through contact and convection through the gas separately. Using subscripts "c" and "g" to refer to contact and gas, respectively, $K_c$ is then the heat transfer coefficient due to contact and $K_g$ is the heat transfer coefficient due to the gas. The initial Mesa Areal Density $\alpha_i = A_i/A_p$ is the initial fraction of the insulating layer of the chuck within the probe area which has a raised surface in nominal contact with the wafer piece, and $\alpha_f$ is the final Mesa Areal Density having a raised surface in nominal contact with the wafer piece after the preferred adjustments have been made. Nominal is used to mean the planar-equivalent surface of the mesa at the top, where the mesa supports the wafer. In other words, ignoring roughness and non-parallelism, $\alpha$ is the total cross-sectional area of the mesas within the probe area $A_p$ at the supporting surface of the wafer. Thus mesa configurations of differing detailed geometry, e.g. square vs. circular cross section or vertical vs. sloped walls, need not have differing $\alpha$. For a given probe measurement, $\alpha_f$ is sought to determine the target high area, and thus the amount by which the high area under the probe must be reduced in order to achieve the desired temperature distribution. An equation providing $\alpha_f$ for a given probe measurement area is determined as follows:

In a preferred embodiment, a target HTC in a localized area of the mesa configuration is achieved by removal of material. In accordance with the above discussion, a removal of material will result in a reduction of heat flux from the wafer and thus an increase in wafer temperature. Therefore using material removal alone, a desired wafer temperature can be achieved by selecting a target $\Delta T$ that is at least as high as the highest of the measured $\Delta T$'s. A target $\Delta T$ for all sites across the chuck is thus chosen and denoted $\alpha T_o$, and will, in general differ from the measured $\Delta T$'s, individually denoted by $\Delta T_m$, by an amount denoted by $\in$, wherein:

$$\in = \Delta T_m - \Delta T_o. \tag{1}$$

The objective of the adjustment is then to bring $\in$ to zero. Defining q as the heat flux per unit area, the general heat transfer equation is given as $$q = Q/A_p = \Delta T \times K_{eff}. \tag{2}$$

As mentioned above, the effective heat transfer coefficient $K_{eff}$ is composed of two components: the convection-only heat transfer in the low regions, and the conduction plus convection heat transfer in the high regions. For the case where the contact area is much smaller than the non-contact area (comprising both the low area and the high area not in contact), $K_{eff}$ for the target configuration can be expressed as $K_g + \alpha_f K_c$. A desired heat flux Q is selected by varying the probe heater power and choosing a value which results in a clear reading everywhere on the chuck, and one which shows a clear difference between regions with different mesa areal densities. An exemplary heat flux is from about 0.2 to about 2.0 W/cm$^2$, and the temperature of the heater is determined by the heat flux.

Denoting the initial effective heat transfer coefficient by $K_i = q/\Delta T_m$, and using the target value of $K_{eff}$ of $q/\Delta T_o$, Eqn. 1 can be rewritten using Eqn. 2 as:

$$\in = q/K_i - q/(K_g + \alpha_f K_c). \tag{3}$$

Defining $\gamma$ to be $K_g/K_c$ and rearranging Eqn. 3, $$\alpha_f = (\in/q)\gamma K_i + \alpha_i/[1 - (\in/q)K_i]. \tag{4}$$

The set of $K_i$ determined for the plurality of measurement sites, along with the x-y coordinates of each $K_i$ can be used to determine an HTC profile. Additionally, using Eqn. 3, the set of $K_i$ taken together with the set of $\in$ can be used to determine $K_{eff}$ for the target configuration, and thus a target HTC profile. Similarly, the set of $\alpha_f$ determined for the plurality of measurement sites along with the x-y coordinates of each $\alpha_f$ determine the areal component of the target mesa configuration.

For a given chuck, $\gamma$ is assumed to be constant. This is because primary factors inherent in $K_c$ are evidently the material itself and the surface finish of the material, both of which are preferably constant for a measurement made from anywhere on the chuck. $K_g$ is a function of the material and the gas pressure used, which are also assumed to be constant. Furthermore, $\gamma$ is determinable by measuring K at different locations with different and known mesa areal densities, and solving independently for $K_g$ and $K_c$. For this assessment, therefore, y is assumed to be known and constant.

The testing can be carried out in an apparatus that would allow for support of the chuck as well as enablement of the desired test conditions. An appropriate apparatus comprises a vacuum test chamber configured to maintain the chuck at a set temperature and capable of backfill of a heat conducting gas. The apparatus is preferably capable of supporting and numerically controlling x-y positioning of a heat flux probe as well as capable of applying a contact force of the probe onto the chuck. The apparatus is also preferably capable of registering and recording measurement data signals from the probe, as well as electronically determining the target mesa configuration from the data.

The measurement areas can overlap or can be separated by a distance. The regions between measurement areas can be adjusted to interpolated areal densities or to gradual transitional densities such that no abrupt changes in density and thus in HTC occur. Interpolation can be effected, for example, by changing areal density linearly between two different densities. In general, if the density transitions from site to site are too abrupt, a finer measurement grid and/or a small probe diameter may be required. Adequate readings may be obtained by allowing some measurement sites to be omitted, or by making measurements in an irregular pattern.

All of the factors required to determine $\alpha_f$ have thus been determined. Based on all prior discussion, a preferred embodiment of a process involving reducing the localized mesa area of an ESC to achieve a target HTC profile across a wafer placed on a chuck comprises the following experimental procedure:

1. Size a heat flux probe so that its mass results in a force on an ESC approximating that of the ESC clamping force, e.g. 40 Torr.
2. Place the ESC to be tested in a vacuum chamber, keeping the temperature of the conductive support constant by employing a TCU.
3. Position the probe at the measurement site on the chuck surface.
4. Evacuate the chamber and backfill to the desired helium pressure, e.g. 20 Torr.
5. Select the desired heat flux Q.
6. Calculate q from Q using the known $A_p$.
7. Measure and record the resultant wafer piece temperature and conductive support temperature, thus determining $K_i = q/\Delta T_m$ for all sites on the grid.
8. Select a target $\Delta T = \Delta T_o$ and determine $\in$ for each site.
9. Use Equation 4 to determine $\alpha_f$ for all sites on the grid. Check that $\alpha_f$ is always less than $\alpha_i$.

A mechanical correction can now be made to the chuck to achieve a more uniform thermal conductivity across the chuck. The mesa areal density within the measurement area is adjusted to reduce the contact area by an amount sufficient to change the local $\alpha_i$ to $\alpha_f$. This can conveniently be accomplished using any of known techniques for coordinate controlled material removal, where removal is effected, for example, by routing, laser machining or grit blast machining, and coordinate control is effected by the use of an X-Y table. Area reduction can be carried out by reducing the area of any number of mesas within the measurement area, or removing some mesas completely, or any combination thereof. The area reduction process is repeated for each probe measurement site.

After completion of mechanical correction and achieving $\alpha_f$ at all measured sites, the overall process could be repeated to achieve compliance to a predetermined tolerance band around $\Delta T_o$. It is appreciated that robotics and machine control computers can be used to automate this procedure.

In plasma etch chambers, bias RF power can be adjusted based on a voltage probe measurement attached to an electrostatic chuck electrode. An error in the voltage measurement may affect the etch process. Furthermore, variation in topography of the electrode relative to the wafer may lead to a variation in the local sheath potential, and consequently in the etch process performance as well. In a plasma reactor, an ESC may be considered to comprise part of a capacitive circuit, wherein the plasma is the first conductor, the insulating layer of the ESC is the dielectric, and the conductive body of the ESC is the second conductor. A preferred embodiment involves the local modification of a mesa configuration of an ESC to achieve more uniform etch conditions across the wafer surface. The local modification is the adjustment of mesa height to control capacitance. Another preferred embodiment involves the initial fabrication of a mesa configuration of an ESC to achieve uniform etch conditions across the wafer surface.

A capacitance probe is preferably used on an ESC to measure the capacitance between the probe head and the conductive body. Capacitance meters of sufficient accuracy of +/−1 pF or better can be used, such as the Protek CM110 available from Testextra LLC, Freehold, N.J. The meter is used in conjunction with a probe, which is preferably about 1" in diameter, and comprises a metal cylinder which has a plastic handle extending out of the top. Using the capacitance probe, a measurement is made at preselected points on the ESC. Preferably, the preselected points form a regular grid pattern, allowing for the determination of a capacitance profile, i.e. a profile of capacitance across the chuck. Assuming a plurality of mesas is included in the measurement, the high and the low areas of the mesa array will contribute differently to the measured capacitance reading.

Example 2

This example is for the initial fabrication of mesas, where initial capacitance measurements are made before mesas have been fabricated, i.e. when the surface of the insulating layer is planar. Mesas are fabricated by removing material from the area where there are no mesas. Areas which become mesa areas remain untouched, and provide the high area upon which the wafer is supported. A determination of depth is developed in accordance with a procedure in which the Mesa Areal Density is known (provided by the above discussion), and mesas are going to be, but have not yet been, fabricated at a certain height. Assuming that the mesa area is small compared to $A_p$, we write a capacitance equation which relates only to the low areas. Using notation $C_g$ for the capacitance due to the gap (the area that will be between the mesas when they are formed), and $C_i$ for the capacitance of the insulating layer below the gap, then the target capacitance $C_T$ (i.e. the capacitance of the area between mesas achieved at the desired mesa height) can be expressed as $$1/C_T = 1/C_g + 1/C_i. \tag{5}$$

From $C = \in A/d$:

$$\in_o A_p/C_T = d_g + d_i/\in_i, \tag{6}$$

where $\in_i$ is the dielectric constant of the insulating layer, $d_i$ is the thickness of the insulator below the gap, and $d_g$ is the height of the gap. At the onset of the procedure, the capacitance is measured while the surface is flat, so $C_m$, the measured capacitance is given by:

$$C_m = \in_o A_p \in_i /(d_g + d_i). \tag{7}$$

Solving Eqns. 6 and 7 for $d_g$ gives:

$$d_g = \in_o A_p [(1/C_T - 1/C_m)/(1 - 1/\in_i)]. \tag{8}$$

Eqn. 8 thus provides a desired mesa height within each measurement area resulting in the determination of a $C_m$, for the case where the mesas are not present prior to the fabrication. The set of $C_T$ determined for the plurality of measurement sites, along with the x-y coordinates of each $C_T$ can be used to determine a target capacitance profile. Additionally, the set of $d_g$ determined for the plurality of measurement sites along with the x-y coordinates of each $d_g$ determine the height component of the target mesa configuration.

A mechanical fabrication can now be carried out on the chuck to achieve the desired capacitance profile across the chuck. Preferably, mesas are then created within the measurement site by removing material in the area that will become the low area around the mesas to a depth sufficient to change the local $C_m$ to $C_T$. The depth of the material removal is preferably from 5 μm to 40 μm, and more preferably from 5 μm to 20 μm. This can conveniently be accomplished using any of known techniques for coordinate controlled material removal, where removal is effected, for example, by routing, laser machining or grit blast machining, and coordinate control is effected by the use of an X-Y table. The machining process is repeated for each probe measurement site.

The measurement areas can overlap or can be separated by a distance. The regions between measurement areas can be fabricated to interpolated depths or to gradual transitional depths such that no abrupt changes in depth and thus in capacitance occur. Interpolation can be effected, for example, by changing depth linearly between two different depths. In general, if the depth transitions from site to site are too abrupt, a finer measurement grid and/or a small probe diameter may be required. Adequate readings may be obtained by allowing some measurement sites to be omitted, or by making measurements in an irregular pattern.

All of the factors required to determine $d_g$ have thus been determined. Based on the above discussion, a preferred embodiment of a process involving initially fabricating the mesa height of an ESC to reduce a capacitance variation across a wafer placed on a chuck comprises the following procedure:
1. Fabricate the ESC up to just prior to mesa fabrication.
2. Measure the capacitance from the surface to the conductive body using a suitable probe over a pre-defined measurement grid to determine the set of $C_m$.
3. Determine a pre-defined target capacitance $C_T$.
4. Use Eqn. 8 to determine the set of $d_g$, the target depth at each measurement site.
5. Create the mesas at each site by machining.
6. Adjust the machining processing in a continuous fashion to gradually transition from site to site to achieve the desired local mesa height.

Example 3

In the case where the mesas already exist on the chuck, an adjustment of mesa height to achieve a desired capacitance profile may be needed. In one embodiment, $C_T$ is chosen so that the target capacitance profile is uniform across the chuck. In order to achieve a final uniform capacitance most efficiently it is useful to determine the relationship between material removal and capacitance. From Eqn. 6, above, the capacitance due to the low area is given by $\in_o A_p/(d_g+d_i/\in_i)$. Since the sum of $d_i$ and $d_g$ is a constant, the capacitance can be rewritten as $\in_i \in_o A_p/[d_g (\in_i-1)+h]$, where $h=d_i+d_g$. For dielectric materials, $\in_i$ is greater than 1, so $\in_i-1$ is positive. Thus it can be seen that an increase in the gap depth will result in a decrease in the capacitance. Thus in the preferred embodiment, where material is only removed, capacitance can only be reduced. The selection of $C_T$ in this case, therefore, is preferably equal to or less than the lowest measured capacitance from all selected sites.

A mechanical correction can now be made to the chuck to achieve the desired capacitance profile across the chuck. Preferably, mesas are then adjusted within the measurement site by deepening material around the mesas to a depth sufficient to change the local $C_m$ to $C_T$. This can conveniently be accomplished using any of known techniques for coordinate controlled material removal, where removal is effected, for example, by routing, laser machining or grit blast machining, and coordinate control is effected by the use of an X-Y table. The machining process is repeated for each probe measurement site.

The measurement areas can overlap or can be separated by a distance. The regions between measurement areas can be adjusted to interpolated depths or to gradual transitional depths such that no abrupt changes in depth and thus in capacitance occur. Interpolation can be effected, for example, by changing depth linearly between two different depths. In general, if the depth transitions from site to site are too abrupt, a finer measurement grid and/or a small probe diameter may be required. Adequate readings may be obtained by allowing some measurement sites to be omitted, or by making measurements in an irregular pattern.

Based on the above discussion, a preferred embodiment of a process involving adjusting the mesa height of an ESC to reduce a capacitance variation across a wafer placed on a chuck comprises the following procedure:
1. Measure the capacitance from the surface to the conductive body using a suitable probe over a pre-defined measurement grid.
2. Determine a pre-defined target capacitance $C_T$.
3. Determine whether the depth needs to be increased or decreased for each grid site.
4. Adjust the mesa height at each site by machining such that $C_m$ approaches $C_T$.
5. Repeat the process as needed until all sites are within a desired tolerance of $C_T$.
6. Adjust the machining processing in a continuous fashion to smoothly transition from site to site to achieve the desired local mesa height.

With the methods described above, it is possible to provide customization of electrical and thermal properties of an electrostatic chuck for the purpose of achieving a target heat transfer coefficient or capacitance profile.

The present embodiments have been described with reference to preferred embodiments. However, it will be readily apparent to those skilled in the art that it is possible to embody the invention in specific forms other than as described above without departing from the spirit of the embodiment. The preferred embodiment is illustrative and should not be considered restrictive in any way. The scope of the embodiment is given by the appended claims, rather than the preceding description, and all variations and equivalents which fall within the range of the claims are intended to be embraced therein.

What is claimed is:

1. A method of determining a target mesa configuration of an electrostatic chuck, comprising:
    making a plurality of localized measurements using a heat flux probe moved by a numerically controlled positioning apparatus at a plurality of locations on an exposed surface of an insulating layer of an electrostatic chuck wherein the plurality of measurements are carried out in a vacuum chamber backfilled with helium at a pressure of 2 Torr to 200 Torr; and
    determining the target mesa configuration using the measurements.

2. The method of claim 1 wherein the target mesa configuration is determined from a target heat transfer coefficient profile.

3. The method of claim 1, wherein the target mesa configuration is achieved by reducing a mesa contact area at one or more of the locations.

4. The method of claim 3 wherein the target mesa configuration is fabricated by routing, laser machining and/or grit blasting.

5. The method of claim 3 wherein the chuck is located in the interior of a plasma processing chamber.

6. The method of claim 1 wherein the surface of the insulating layer includes a mesa pattern, the method further comprising removing insulating material to achieve a mesa contact area corresponding to the target mesa configuration.

7. The method of claim 6 wherein the insulating layer of the chuck is less than 5 mm thick.

8. The method of claim 1 wherein the surface of the insulating layer includes a mesa pattern and at least 3, mesas are included in the heat flux probe measurement.

9. The method of claim 1 wherein the target mesa configuration comprises mesas having elliptical, torroidal and polygonal cross-sectional shapes.

10. The method of claim 1 wherein the target mesa configuration comprises mesas having a maximum dimension in cross-section of about 0.1 mm to about 10 mm.

11. The method of claim 1 wherein the target mesa configuration comprises a spacing between mesas of from about 0.5 mm to about 5 mm.

12. The method of claim 1 wherein the measurements are taken at a plurality of locations arranged in a grid pattern.

13. The method of claim 1 wherein the electrostatic chuck includes fluid channels adapted to cooperate with a temperature control unit to control the temperature of the chuck.

14. The method of claim 1 wherein the heat flux probe applies a pressure of 10 Torr to 100 Torr to the insulator surface.

15. The method of claim 1 further comprising customizing a preexisting mesa pattern to correspond to the target mesa configuration by routing, laser machining and/or grit blasting.

16. A method to achieve compliance to a predetermined heat transfer coefficient tolerance wherein the method of claim 15 is applied a plurality of times.

17. An apparatus useful for determining a target mesa configuration, including a vacuum chamber, a support to hold a chuck, a numerically controlled positioning member capable of applying a contact force of a heat flux probe onto the chuck, the heat flux probe supported by the positioning member, a controller operable to move the positioning member to various positions on the chuck surface, and a unit capable of registering and recording measurement data signals from the heat flux probe, electronically determining the target mesa configuration from the data signals, and determining the target mesa configuration.

* * * * *